(12) United States Patent
Kishi et al.

(10) Patent No.: US 10,347,551 B2
(45) Date of Patent: Jul. 9, 2019

(54) SEMICONDUCTOR PACKAGE

(71) Applicant: KABUSHIKI KAISHA TOSHIBA, Tokyo (JP)

(72) Inventors: Hiroaki Kishi, Yokohama Kanagawa (JP); Akito Shimizu, Fuchu Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/694,958

(22) Filed: Sep. 4, 2017

(65) Prior Publication Data

US 2018/0076107 A1    Mar. 15, 2018

(30) Foreign Application Priority Data

Sep. 12, 2016 (JP) .................. 2016-177832

(51) Int. Cl.
*H01L 23/00* (2006.01)
*H01L 23/13* (2006.01)
(Continued)

(52) U.S. Cl.
CPC .............. *H01L 23/13* (2013.01); *H01L 23/16* (2013.01); *H01L 23/3114* (2013.01); *H01L 23/367* (2013.01); *H01L 23/3672* (2013.01); *H01L 23/4334* (2013.01); *H01L 23/49503* (2013.01); *H01L 23/49548* (2013.01); *H01L 23/49822* (2013.01); *H01L 23/3107* (2013.01); *H01L 23/3128* (2013.01); *H01L 24/29* (2013.01); *H01L 24/32* (2013.01); *H01L 24/48* (2013.01); *H01L 24/73* (2013.01); *H01L 2224/291* (2013.01); *H01L 2224/293* (2013.01);
(Continued)

(58) Field of Classification Search
CPC ..... H01L 23/13; H01L 23/16; H01L 23/3114; H01L 23/367; H01L 23/3672; H01L 23/4334; H01L 23/49503; H01L 23/49548; H01L 23/49822; H01L 23/4952; H01L 21/4828
USPC .............. 257/676, 666, 669, 777, 783, 786, 257/E21.502, E21.503, E21.505, E23.031, 257/E23.037, E23.052; 438/106, 111, 438/112, 123, 124
See application file for complete search history.

(56) References Cited

U.S. PATENT DOCUMENTS 6,197,615 B1 * 3/2001 Song ................ H01L 23/49503
257/E23.037
6,498,392 B2 * 12/2002 Azuma ............... H01L 21/4832
257/676
(Continued)

FOREIGN PATENT DOCUMENTS

JP    H09082849 A    3/1997
JP    2011052240 A    3/2011
(Continued)

*Primary Examiner* — Dao H Nguyen
(74) *Attorney, Agent, or Firm* — Kim & Stewart LLP

(57) ABSTRACT

A semiconductor package comprises a resin material, a semiconductor chip in the resin material, and a metal member in the resin material. The metal member has a first surface that faces the semiconductor chip and a second surface that is opposed to the first surface. The first surface of the metal member has a plurality of first recess portions formed thereon. The first recess portions extend into the metal member and have an opening width that is less than a bottom width.

20 Claims, 4 Drawing Sheets

(51) Int. Cl.
*H01L 23/16* (2006.01)
*H01L 23/31* (2006.01)
*H01L 23/367* (2006.01)
*H01L 23/433* (2006.01)
*H01L 23/495* (2006.01)
*H01L 23/498* (2006.01)

(52) U.S. Cl.
CPC ............ *H01L 2224/2929* (2013.01); *H01L 2224/29386* (2013.01); *H01L 2224/32225* (2013.01); *H01L 2224/32245* (2013.01); *H01L 2224/48091* (2013.01); *H01L 2224/48227* (2013.01); *H01L 2224/48247* (2013.01); *H01L 2224/73215* (2013.01); *H01L 2224/73265* (2013.01); *H01L 2924/15311* (2013.01)

(56) References Cited

U.S. PATENT DOCUMENTS

| | | | | |
|---|---|---|---|---|
| 6,683,368 B1 * | 1/2004 | Mostafazadeh | ..... | H01L 21/4832 257/666 |
| 7,405,106 B2 * | 7/2008 | Maloney | ............ | H01L 23/3107 257/E23.037 |
| 8,124,447 B2 * | 2/2012 | Chang Chien | ...... | H01L 21/4832 257/E21.502 |
| 8,420,446 B2 * | 4/2013 | Yo | ............ | C25D 5/12 257/E21.505 |
| 8,659,131 B2 * | 2/2014 | Kim | ............ | H01L 21/4832 257/666 |
| 9,831,158 B2 * | 11/2017 | Hayashi | ............ | H01L 23/3114 |
| 2004/0108602 A1 * | 6/2004 | Nakajima | ........... | H01L 23/4334 257/787 |
| 2006/0027900 A1 * | 2/2006 | Takeuchi | ............ | H01L 23/4334 257/675 |
| 2008/0079127 A1 * | 4/2008 | Gerber | ............... | H01L 21/4828 257/676 |
| 2017/0047264 A1 * | 2/2017 | Im | ......................... | H01L 23/367 |

FOREIGN PATENT DOCUMENTS

JP 4931835 B2 5/2012
JP 2016100737 A 5/2016

* cited by examiner

SEMICONDUCTOR PACKAGE

CROSS-REFERENCE TO RELATED APPLICATION

This application is based upon and claims the benefit of priority from Japanese Patent Application No. 2016-177832, filed Sep. 12, 2016, the entire contents of which are incorporated herein by reference.

FIELD

Embodiments described herein relate generally to a semiconductor package.

BACKGROUND

Some semiconductor packages seal a semiconductor chip within a resin material. A heat dissipating member that dissipates heat generated by the semiconductor chip or a die pad to which the semiconductor chip is bonded may be encased by the resin material.

The heat dissipating member and the die pad are typically made of metals. The adhesion between the metal material and the resin material is generally not very high. Thus, it is expected that poor adhesion between the heat dissipating member and the resin will decrease heat dissipation efficiency. It is also expected that poor adhesion between the die pad and the resin material will allow impurities and water to enter via a gap that can be generated between the die pad and the resin material.

DETAILED DESCRIPTION

In general, according to one embodiment, a semiconductor package, comprise a resin material, a semiconductor chip in the resin material, and a metal member in the resin material. The metal member has a first surface that faces the semiconductor chip and a second surface that is opposed to the first surface. The first surface of the metal member has a plurality of first recess portions formed thereon. The first recess portions extend into the metal member and have an opening width that is less than a bottom width.

Example embodiments of the present disclosure will be described with reference to the drawings hereinafter. These example embodiments are not intended to limit the scope of the present disclosure.

First Embodiment

Figure 1:
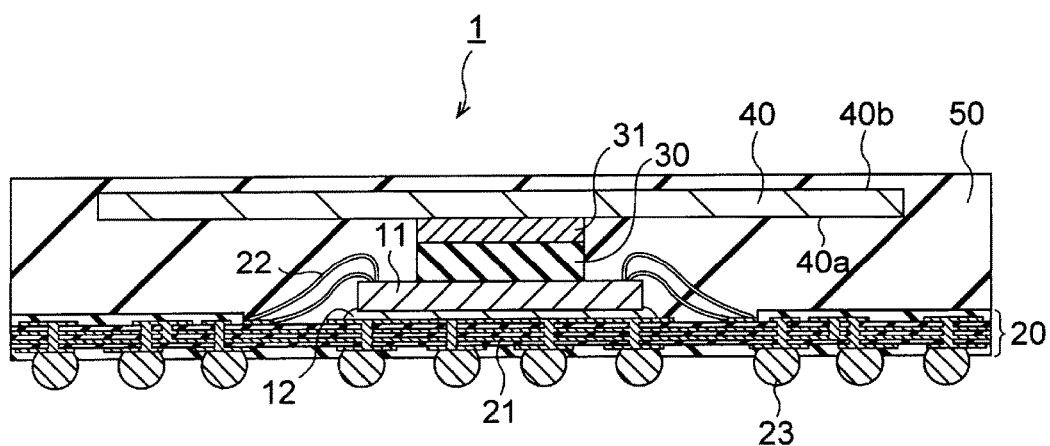
FIG. 1 is a cross-sectional view showing a schematic structure of a semiconductor package relating to a first embodiment.

FIG. 1 is a cross-sectional view showing a schematic structure of a semiconductor package relating to a first embodiment.

A semiconductor package 1 shown in FIG. 1 has a semiconductor chip 11, which is bonded to a surface of a board 20 with a bonding member 12. The semiconductor chip 11 is, for example, a silicon chip. The bonding member 12 is, for example, a resin containing conductive particles, a resin containing an insulating material, or may be solder.

The board 20 is provided with layered wirings 21. That is, the board 20 is a multilayered board. Portions of the wirings 21 are electrically connected to the semiconductor chip 11 by bonding wires 22. Multiple hemispherical terminals 23 are arranged in a grid format on a back surface of the board 20. The terminals 23 are in this instance so-called "solder balls" and are electrically connected to the semiconductor chip 11 via the wirings 21.

A spacer 30 is provided on the semiconductor chip 11. The spacer 30 secures a height space for the bonding wires 22. A plate-like heat dissipating member 40 is connected onto the spacer 30 via a bonding member 31. The bonding member 31 is, for example, a resin containing conductive particles or a resin containing an insulating material, or may be solder.

The heat dissipating member 40 dissipates heat that is generated in the semiconductor chip 11, and thus may be referred to as a so-called "heat slug". The heat dissipating member 40 corresponds to a metal member containing, for example, copper. Here, the structure of the heat dissipating member 40 will be described with reference to FIGS. 2A and 2B.

Figure 2A:
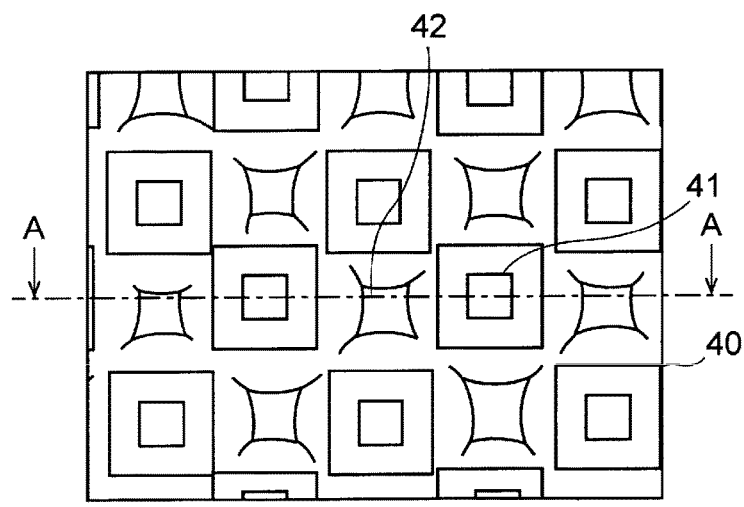
FIG. 2A is an enlarged plane view of the heat dissipating member shown in FIG. 1.
Figure 2B:
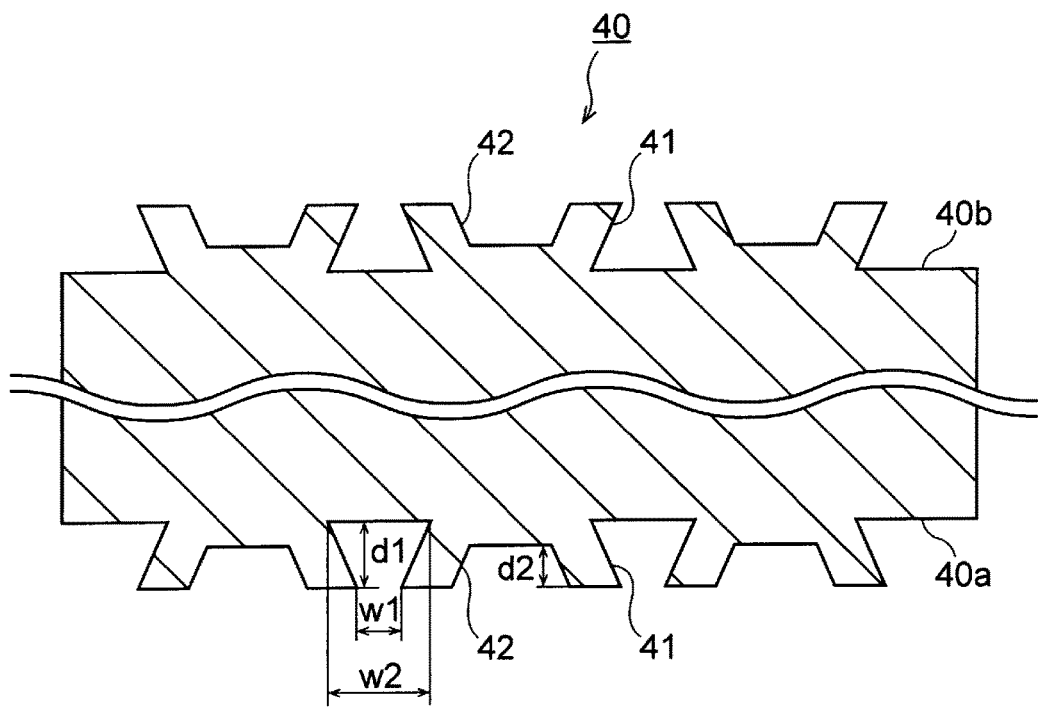
FIG. 2B is a cross-sectional view taken along a line A-A shown in FIG. 2A.

FIG. 2A is an enlarged plane view of the heat dissipating member 40, and FIG. 2B is a cross-sectional view taken along a line A-A shown in FIG. 2A. The heat dissipating member 40 has a surface 40a that faces the semiconductor chip 11 and a surface 40b that is opposed to the surface 40a. Each of the surfaces 40a and 40b is pressed into an uneven shape to provide an uneven texture to the surfaces. The word "pressed" used herein corresponds to "plastic deformation", by which force is applied by a set of two or more tools to a metal material such that the metal is formed into a shape having desired dimensions.

The uneven shape of the surfaces 40a and 40b includes multiple recesses, and the recesses include recess portions 41 and recess portions 42 that are alternately provided. The recess portions 41 have an opening width W1 that is smaller than a bottom width W2. The recess portions 42 have a depth d2 that is smaller than the depth d1 of the recess portions 41.

The surfaces 40a and 40b may be pressed into the uneven shape at the same time or one by one. In this example, the uneven shape of the surface 40a and the uneven shape of the surface 40b are the same. However, the uneven shapes of the surface 40a and 40b may also differ from each other. In such a case, the uneven shapes of the surfaces 40a and 40b may differ from each other in the ratio of the opening width W1 to the bottom width W2 or in the ratio of the depth d1 to the depth d2, for example.

By referring to FIG. 1 again, both of the surfaces 40a and 40b are depicted as covered with a resin material 50. The resin material 50 is made of an epoxy resin, for example. The resin material 50 seals the semiconductor chip 11, the heat dissipating member 40, and other components.

Figure 3:
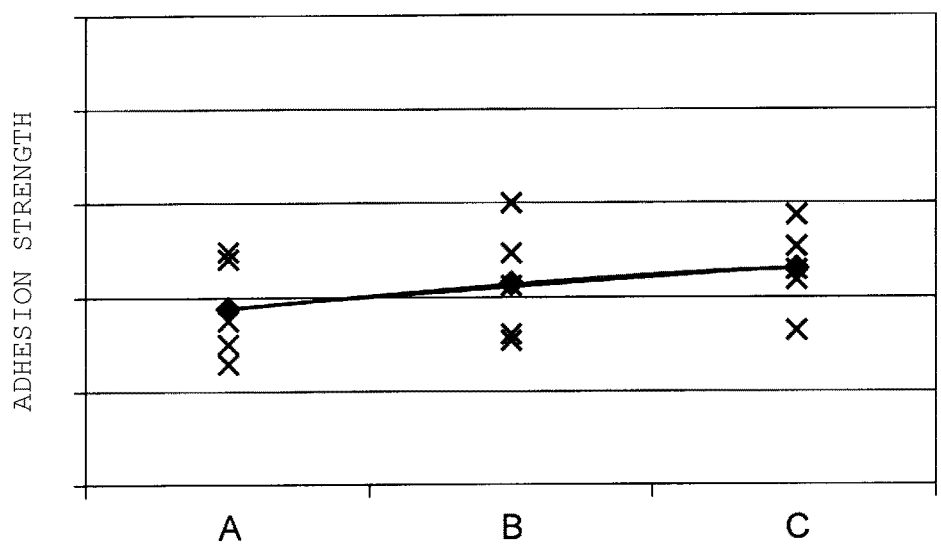
FIG. 3 shows experimental results of adhesion strength between a heat dissipating member and a resin.

FIG. 3 shows experimental results of adhesion strength between the heat dissipating member 40 and the resin material 50. FIG. 3 shows adhesion strength for a case "A" in which the surfaces 40a and 40b of the heat dissipating member 40 are flat, that is, the uneven shape is not formed on these surfaces. Also, FIG. 3 shows adhesion strength for a case "B" in which the surfaces of the heat dissipating member 40 are formed into an uneven shape by a wet chemical etching process (redox treatment) as a roughening treatment. Further, FIG. 3 shows adhesion strength for a case "C" in which the surfaces of the heat dissipating member 40 are pressed into the uneven shape, which corresponds to the adhesion strength of this first embodiment.

As shown in FIG. 3, when average values of the adhesion strengths of the three cases are compared, the adhesion strength of case "C" is the highest. The reason for this is that the recess portions 41 of this first embodiment have an opening width W1 that is smaller than the bottom width W2. The small opening width W1 makes the resin material 50 more difficult to separate from the recess portions 41. That is, the surfaces 40a and 40b in case "C" have an improved anchoring effect. Consequently, the adhesion between the heat dissipating member 40 and the resin material 50 is improved, and decreases in the heat dissipation efficiency are avoided.

The uneven shape is formed by pressing in this first embodiment. The pressing method enables further reduction in processing time and in processing cost as compared with a case of forming the uneven shape by a redox treatment or other roughening method.

In this first embodiment, the recess portions 41 and 42 are alternately formed, and the depth d2 of the recess portions 42 is smaller than the depth d1 of the recess portions 41. This structure allows for easier forming of the recess portions 41, which have a smaller open width W1 and the larger depth d1, by pressing.

Second Embodiment

Figure 4:
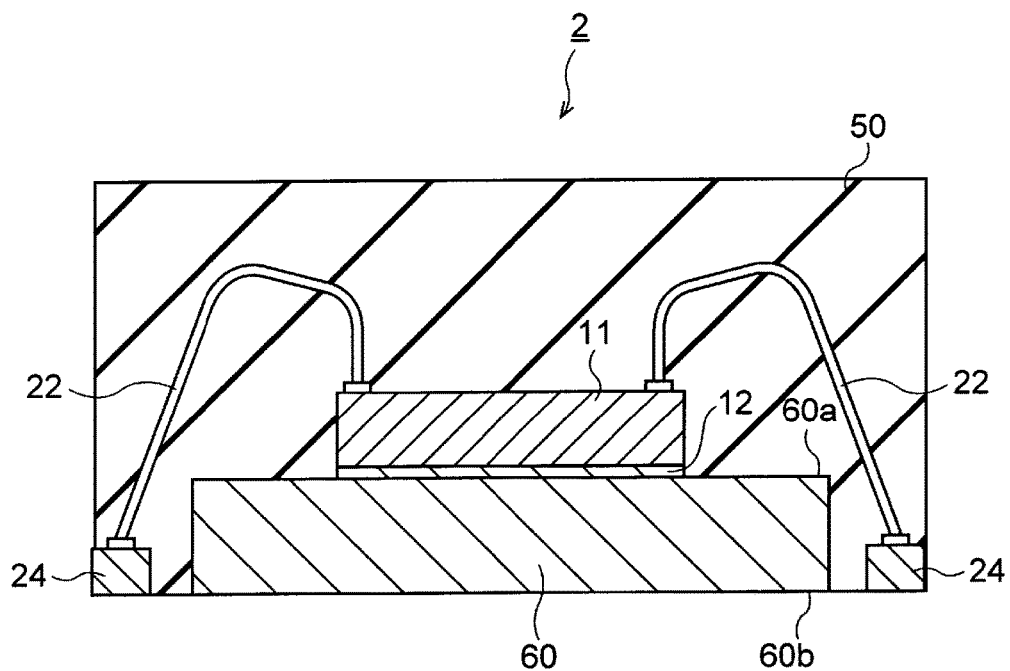
FIG. 4 is a cross-sectional view showing a schematic structure of a semiconductor package relating to a second embodiment.

FIG. 4 is a cross-sectional view showing a schematic structure of a semiconductor package relating to a second embodiment. The structural components that are in common with those in the first embodiment are indicated by the same reference symbols in FIG. 4, and description of these structural components may be omitted.

A semiconductor package 2 shown in FIG. 4 has a semiconductor chip 11, which is bonded to a die pad 60 with a bonding member 12. The semiconductor chip 11 is electrically connected to lead frames 24 by bonding wires 22.

In this example, the die pad 60 corresponds to a metal member containing, for example, copper. The die pad 60 has a surface 60a that faces the semiconductor chip 11 and a surface 60b that is opposed to the surface 60a. In this second embodiment, as depicted in FIG. 4, the surface 60a is covered with a resin material 50, whereas the surface 60b is not. That is, the surface 60b is left exposed from semiconductor package 2.

Figure 5:
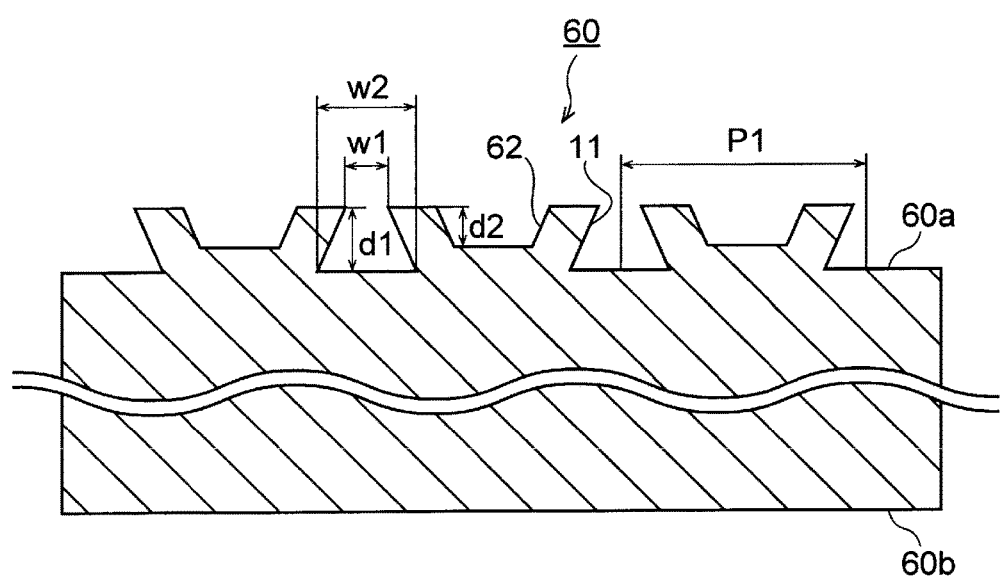
FIG. 5 is an enlarged cross-sectional view of a die pad depicted in FIG. 4.

FIG. 5 is an enlarged view of the die pad 60. In this second embodiment, the surface 60a, which contacts the resin material 50, has been pressed into an uneven shape similar to the first embodiment. However, the surface 60b, which is not covered with the resin material 50, has not been pressed into an uneven shape. That is, the surface 60b is flat.

The surface 60a has recess portions 61 and recess portions 62 that are alternately provided along the surface. Here, the recess portions 61 and 62 correspond to the recess portions 41 and 42, which were described in the first embodiment. That is, the recess portions 61 are made to have an opening width W1 that is smaller than a bottom width W2 so to increase the adhesion to the resin material 50. Also, the recess portions 62 are made to have a depth d2 that is smaller than the depth d1 of the recess portions 61 so that the recess portions 61 can be more easily formed.

A semiconductor chip 11 is bonded to the die pad 60. A center pitch P1 (refer to FIG. 5) between the recess portions 61 or the recess portions 62 is desirably small so that the die pad 60 and the semiconductor chip 11 can be bonded together effectively. For example, the center pitch P1 is desirably no more than 0.1 mm when the semiconductor chip 11 has a side length of 8 mm or less.

In this second embodiment, the surface 60a is provided with the recess portions 61 having an opening width W1 that is smaller than the bottom width W2. Thus, the surface 60a provides a large anchoring effect when covered with the resin material 50. Consequently, the adhesion between the die pad 60 and the resin material 50 is improved, thereby inhibiting impurities and water from entering into the semiconductor chip 11.

Although the surface 60b is not formed into the uneven shape in this example, the surface 60b could also be formed into the uneven shape in other examples.

Third Embodiment

Figure 6:
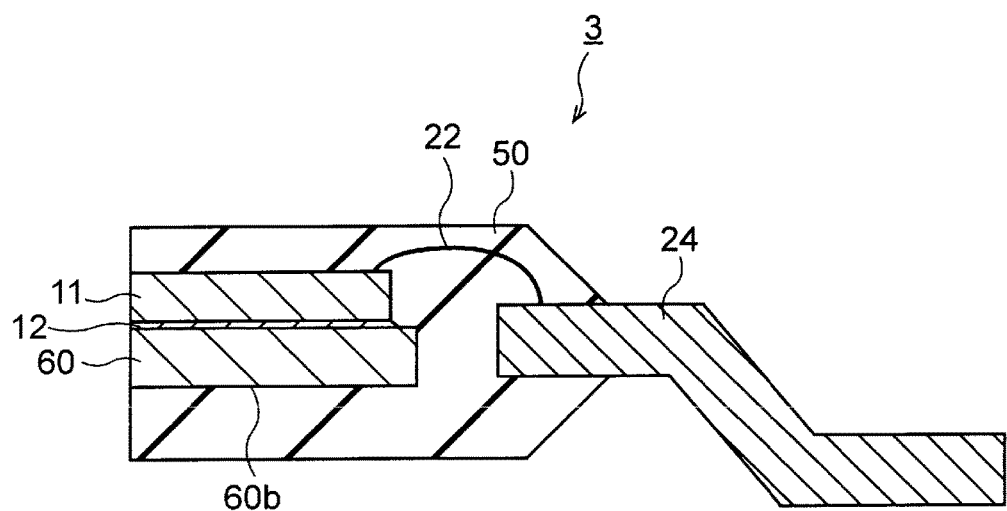
FIG. 6 is a cross-sectional view showing a schematic structure of a semiconductor package relating to a third embodiment.

FIG. 6 is a cross-sectional view showing a schematic structure of a semiconductor package relating to a third embodiment. The following description mainly describes features of the third embodiment that differ from those in the second embodiment.

A semiconductor package 3 shown in FIG. 6 has a die pad 60 that is almost totally encased within a resin material 50. That is, not only a surface 60a of the die pad 60 but also a surface 60b of the die pad 60 is covered with the resin material 50.

Figure 7:
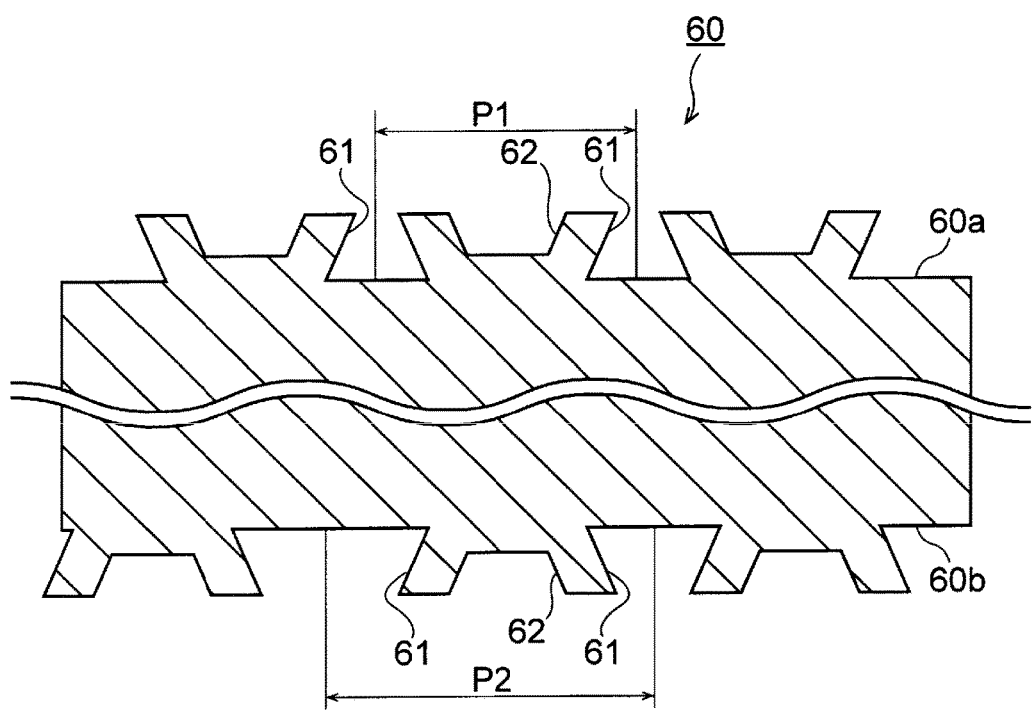
FIG. 7 is an enlarged cross-sectional view of a die pad depicted in FIG. 6.

FIG. 7 is an enlarged sectional view of the die pad 60 of this third embodiment. As shown in FIG. 6, the surfaces 60a and 60b are both contacting the resin material 50. Thus, both of the surfaces 60a and 60b are formed with recess portions 61 and 62 that are alternately provided as was described in the second embodiment. This structure secures the adhesion between the die pad 60 and the resin material 50.

A semiconductor chip 11 is bonded to the surface 60a in this third embodiment. In view of this structure, a center pitch P1 of the recess portions 61 on surface 60a is desirably set so that the bonding to the semiconductor chip 11 will be provided optimally. On the other hand, the semiconductor chip 11 is not bonded to the surface 60b, and thus, a center pitch P2 of the recess portions 61 on the surface 60b can be set so that the adhesion with the resin material 50 will be provided optimally. That is, the center pitch P1 and the center pitch P2 may differ from each other.

In this third embodiment, the surfaces 60a and 60b are provided with the recess portions 61 having an opening width W1 that is smaller than a bottom width W2. Thus, each of the surfaces 60a and 60b provides an improved anchoring effect to the resin material 50. Consequently, the adhesion between the die pad 60 and the resin material 50 is improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor package, comprising:
   a resin material;
   a semiconductor chip in the resin material; and
   a metal member in the resin material and having a first surface that faces the semiconductor chip and a second surface that is opposed to the first surface, wherein
   the first surface of the metal member has a plurality of first recess portions formed thereon by plastic deformation, and
   the first recess portions extend into the metal member and have an opening width that is less than a bottom width.

2. The semiconductor package according to claim 1, wherein the first surface includes a plurality of second recess portions thereon, each first recess portion being adjacent to at least one second recess portion, and a depth to which each second recess portion extends into the metal member being less than a depth to which each first recess portion extends into the metal member.

3. The semiconductor package according to claim 1, wherein
   the second surface of the metal member has a plurality of third recess portions formed thereon, and
   the third recess portions extend into the metal member and have an opening width that is less than a bottom width.

4. The semiconductor package according to claim 3, wherein the third recess portions have substantially the same shape and size as the first recess portions.

5. The semiconductor package according to claim 3, wherein the opening width of the third recess portions is different from the opening width of the first recess portions.

6. The semiconductor package according to claim 3, wherein a center-to-center pitch of the plurality of first recess portions along a first direction parallel to the first surface is substantially equal to a center-to-center pitch of the plurality of third recess portions along a second direction parallel to the second surface.

7. The semiconductor package according to claim 1, further comprising:
   a spacer on the semiconductor chip between the first surface of the metal member and the semiconductor chip, wherein
   the metal member is a heat dissipating member and at least a portion of the second surface is exposed from the resin.

8. The semiconductor package according to claim 1, wherein the semiconductor chip is mounted on the first surface of the metal member, and the metal member is a die pad.

9. The semiconductor package according to claim 8, wherein a center-to-center pitch of the first recess portions along a direction parallel to the first surface is less than or equal to 0.1 mm.

10. The semiconductor package according to claim 1, wherein a center-to-center pitch of the first recess portions along a direction parallel to the first surface is less than or equal to 0.1 mm.

11. A packaged semiconductor device, comprising:
    a resin material;
    a semiconductor chip in the resin material; and
    a metal member in the resin material and having a first surface that faces the semiconductor chip and a second surface that is opposed to the first surface, wherein
    the first surface of the metal member has an uneven texture comprising a plurality of recesses formed thereon by plastic deformation of the metal member, the plurality of recesses including first recess portions adjacent to second recess portions along the first surface,
    each first recess portion extending into the metal member in a depth direction to a first depth and having an opening width at the first surface that is less than a bottom width at the first depth, and
    each second recess portion extending into the metal member in the depth direction to a second depth that is less than the first depth and having an opening width at the first surface that is greater than a bottom width at the second depth.

12. The packaged semiconductor device according to claim 11, wherein the second surface of the metal member also has the uneven texture.

13. The packaged semiconductor device according to claim 11, wherein
    the second surface of the metal member has an uneven texture comprising a second plurality of recesses formed thereon by plastic deformation, the second plurality of recesses including third recess portions adjacent to fourth recess portions along the second surface,
    each third recess portion extending inwardly into the metal member to a third depth and having an opening width at the second surface that is less than a bottom width at the third depth, and
    each fourth recess portion extending inwardly into the metal member to a fourth depth that is less than the first depth and having an opening width at the second surface that is greater than a bottom width at the fourth depth.

14. The packaged semiconductor device according to claim 13, wherein the first depth is equal to the third depth.

15. The packaged semiconductor device according to claim 13, wherein the first depth is not equal to the third depth.

16. The packaged semiconductor device according to claim 13, wherein a center-to-center pitch of the first recess portion on the first surface is different from a center-to-center pitch of the third recess portions on the second surface.

17. The packaged semiconductor device according to claim 11, wherein
    the metal member is a die pad and the semiconductor chip is attached to a portion of the first surface, and
    a center-to-center pitch of the first recess portions on the portion of the first surface does not exceed 0.1 mm.

18. The packaged semiconductor device according to claim 11, wherein the metal member is a heat dissipating member and the semiconductor chip is connected to the metal member by a spacer.

19. A semiconductor package, comprising:
    a resin material;
    a semiconductor chip in the resin material; and
    a metal member connected to the semiconductor chip and having a first surface directly contacting the resin material, wherein
    the first surface includes an uneven texture formed by plastic deformation of the metal member, and
    the uneven texture comprises a plurality of first recess portions and a plurality of second recess portions,
    each first recess portion extending into the metal member to a first depth,
    each second recess portion extending into the metal member to a second depth that is less than the first depth, and each first recess portion being adjacent to second recess portions and sharing sidewalls with the adjacent second recess portions, the shared sidewalls being angled toward a central portion of the first recess portion such that an opening width of each first recess portion at the first surface is less than a bottom width at the first depth.

20. The semiconductor package according to claim 19, wherein the uneven texture is also formed on a second surface of the metal member opposite the first surface.

* * * * *